United States Patent [19]
Klein

[11] Patent Number: 6,040,714
[45] Date of Patent: Mar. 21, 2000

[54] METHOD FOR PROVIDING TWO MODES OF I/O PAD TERMINATION

[75] Inventor: Dean A. Klein, Eagle, Id.

[73] Assignee: Micron Electronics, Inc., Nampa, Id.

[21] Appl. No.: 08/990,057

[22] Filed: Dec. 12, 1997

[51] Int. Cl.[7] ...................... H03K 19/0175; H03K 17/16
[52] U.S. Cl. .............................. 326/86; 326/30; 326/98; 326/57; 326/71
[58] Field of Search .................................. 326/83, 86, 57, 326/58, 95, 98, 80, 81, 87, 90, 121, 70, 71, 74, 63, 49, 50, 30; 327/108, 109

[56] References Cited

U.S. PATENT DOCUMENTS

| | | | |
|---|---|---|---|
| 4,748,426 | 5/1988 | Stewart | 333/22 R |
| 5,023,488 | 6/1991 | Gunning | 307/475 |
| 5,208,492 | 5/1993 | Masumoto et al. | 326/87 |
| 5,483,188 | 1/1996 | Frodsham | 327/170 |
| 5,530,379 | 6/1996 | Konishi et al. | 326/68 |
| 5,652,538 | 7/1997 | Kimura et al. | 326/83 |
| 5,666,068 | 9/1997 | Ehmann | 326/115 |
| 5,748,028 | 5/1998 | Martin | 327/374 |

*Primary Examiner*—Michael Tokar
*Assistant Examiner*—Richard Roseen
*Attorney, Agent, or Firm*—Park & Vaughan LLP

[57] ABSTRACT

The present invention provides a method of providing two different modes of operation for an output driver on an integrated circuit. A first mode provides an open drain driver, such as an enhanced GTL+ driver, for high-speed data transmission. A second mode provides a totem pole output driver, such as a TTL or a LVTLL driver, which does not require additional circuitry for external terminations, as is required for open drain drivers. Thus, one embodiment of the present invention can be characterized as a method of providing a dual mode output from an integrated circuit. This method includes receiving an output mode signal indicating an enhanced GTL+ output mode or a totem pole output mode. This method also includes providing an enhanced GTL+ output signal if the mode signal indicates the enhanced GTL+ output mode, and providing a totem pole output signal if the mode signal indicates the totem pole output mode. Another embodiment of the present invention can be described as a method for providing a dual mode output from an integrated circuit. This method includes providing to the integrated circuit an output mode signal indicating a first output mode or a second output mode. It also includes coupling an output pin of the integrated circuit to an open drain bus with an active termination if the mode signal indicates the first mode, and coupling an output pin of the integrated circuit to an unterminated bus if the mode signal indicates the second output mode.

13 Claims, 10 Drawing Sheets

METHOD FOR PROVIDING TWO MODES OF I/O PAD TERMINATION

RELATED APPLICATION

The subject matter of this application is related to the subject matter in a co-pending non-provisional application by the same inventor as the instant application and filed on the same day as the instant application entitled, "Integrated Circuit Having Two Modes of I/O Pad Termination," filed on Dec. 12, 1997, Ser. No. 08/990,060.

BACKGROUND

1. Field of the Invention

The present invention relates to the design of input/output (I/O) circuits for semiconductor chips, and more specifically to the design of an I/O circuit that provides two output modes. In a first mode, the output is tailored to drive an open drain bus, which requires an external termination on a bus line. In a second mode, the output functions as a totem pole output, which does not require an external termination.

2. Related Art

Until recently, transistor—transistor logic (TTL) has been the dominant interface standard for semiconductor integrated circuits. Under the TTL standard, an input or an output of at least 2.4 volts corresponds to a logic "1," whereas an input of not more that 0.8 volts and an output of not more than 0.4 volts corresponds to a logic "zero." However, following the recent reduction of power source voltages in semiconductor devices (for example, from 5 volts to 3.3 volts), a reduced voltage version of TTL has emerged, which is known as Low Voltage TTL (LVTTL). Under the LVTTL standard, a signal level definition is divided into a determination level (AC specification), and a final level (DC specification) to which the signal the signal finally arrives. According to the AC specification, an input or an output of at least 2.0 volts corresponds to a logic "1," and an output of not more than 0.8 volts corresponds to a logic "zero." According to the DC specification, an input or an output of at least 2.4 volts corresponds to a logic "1," and an input of not more than 0.8 volts and an output of not more than 0.4 volts corresponds to a logic "zero."

As computer systems require faster data transfer speeds between integrated circuits, the TTL and LVTLL interface standards are beginning to limit computer system performance. For example, the delay time in charging and discharging a typical 100 pF capacitance between the 2.4 and 0.4 volt thresholds is beginning to exceed required access times. Additionally, as switching speeds increase, the output waveform of a TTL or a LVTTL driver becomes distorted due to overshooting, undershooting, ringing and the like, resulting in erroneous level determinations.

Figure 1:
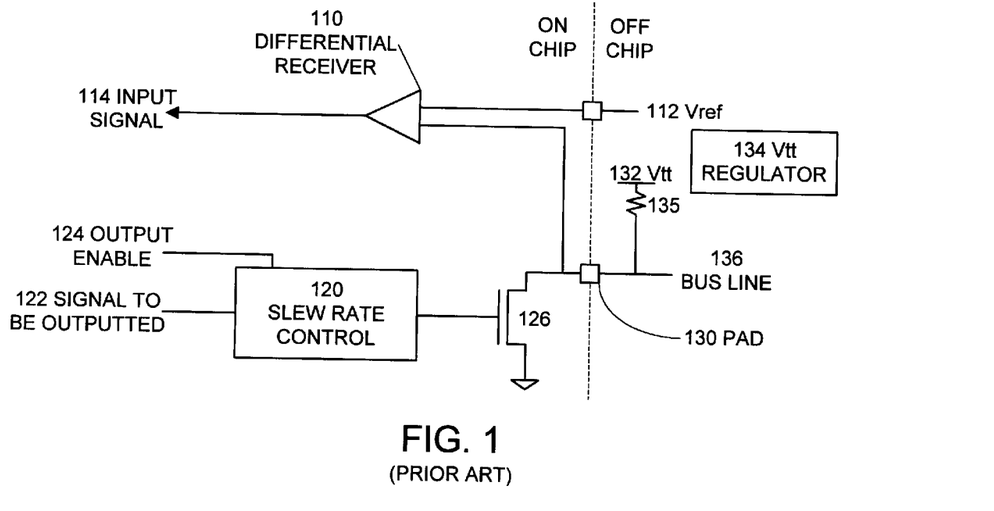
FIG. 1 illustrates the structure of a GTL+ interface on an integrated circuit in accordance with an embodiment of the present invention.

To remedy this problem, computer designers are beginning to use the Gunning transceiver logic (GTL) standard for data transmission. The GTL standard is based upon an open drain bus. A driver for a GTL+ bus is illustrated in FIG. 1 (GTL+ is a variation of GTL). The circuit illustrated in FIG. 1 includes a pad 130, which is coupled to an output driver circuit and an input receiver circuit. Pad 130 is additionally coupled to bus line 136, which is terminated through resistor 135 to $V_{TT}$ 132. Note that $V_{TT}$ 132 is supplied by $V_{TT}$ regulator 134. Typical values for resistor 135 and $V_{TT}$ 132 are 50 ohms and 1.2 volts, respectively.

The GTL output driver circuit includes transistor 126, which can be used to pull pad 130 to a ground voltage. The control input of transistor 126 originates from slew rate control circuit 120. Slew rate control circuit 120 takes inputs from a signal to be outputted 122 and an output enable signal 124. Slew rate control circuit uses these two inputs to selectively activate transistor 126 depending upon the state of inputs 122 and 124. Slew rate control circuit 120 additionally controls the rate at which the voltage on pad 130 changes in order to reduce transient noise on bus line 136.

The GTL input receiver circuit includes a differential receiver 110, which has inputs coupled to pad 130 and $V_{REF}$ 112. Differential receiver 110 includes a differential amplifier that compares the voltage at pad 130 ($V_{PAD}$) to $V_{REF}$. $V_{REF}$ is typically 0.8 volts. Differential receiver 110 produces input signal 114, which is asserted to a high value if $V_{PAD}$ is above $V_{REF}$. Otherwise, input signal 114 is asserted to a low value. Hence, a GTL output takes a value of not more than 0.4 volts for a logic "zero," and a value of greater than $V_{TT}$=1.2 volts for a logic "1." In contrast, the input level takes a value of not more than $V_{REF}$−50 mV=0.75 volts for a logic "zero," and a value greater than $V_{REF}$−50 mV=0.85 volts for a logic "1."

GTL has a number of advantages. Because the impedance of the wiring, the drive transistor and the terminal resistor are all defined at the same level, reflection of an output signal does not easily occur. Furthermore, since the signal amplitude is small, the charge/discharge current does not increase in comparison with that of a TTL interface, even when the capacitive load of the wiring is great.

Figure 2:
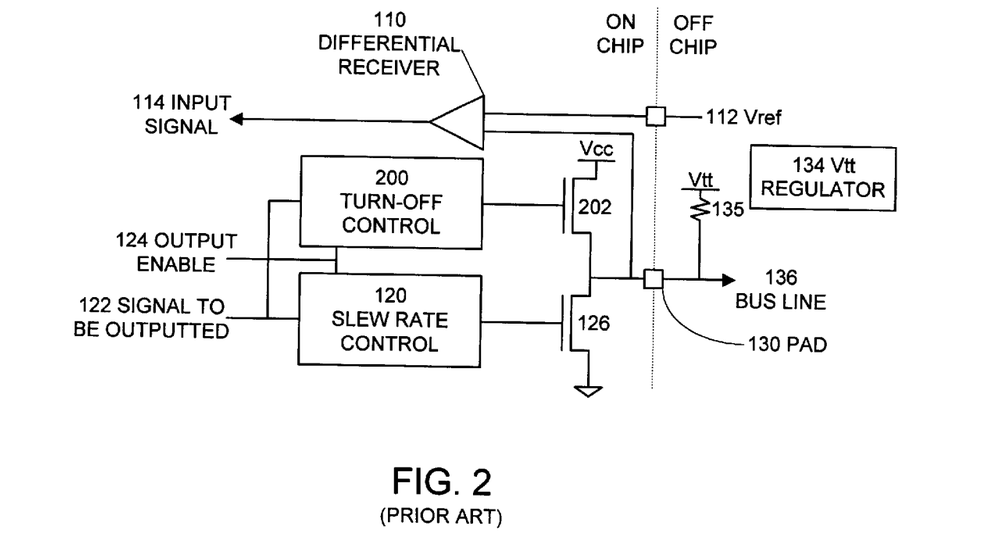
FIG. 2 illustrates the structure of an enhanced GTL+ interface on an integrated circuit in accordance with an embodiment of the present invention.

An enhanced GTL+ driver is illustrated in FIG. 2. The enhanced GTL+ driver differs from the GTL+ driver illustrated in FIG. 1 in that it has a pullup transistor 202 coupled between pad 130 and $V_{CC}$. Pullup transistor 202 is controlled by turn-off control circuit 200. Turn-off control circuit 200 receives signal to be outputted 122 and output enable signal 124 as inputs. It activates pullup transistor 202 for one clock cycle when both signal to be outputted 122 and output enable signal 124 are asserted. Afterwards, turn-off control circuit 200 goes inactive, allowing termination resistor 135 and/or other bus devices to drive bus line 136.

Figure 3:
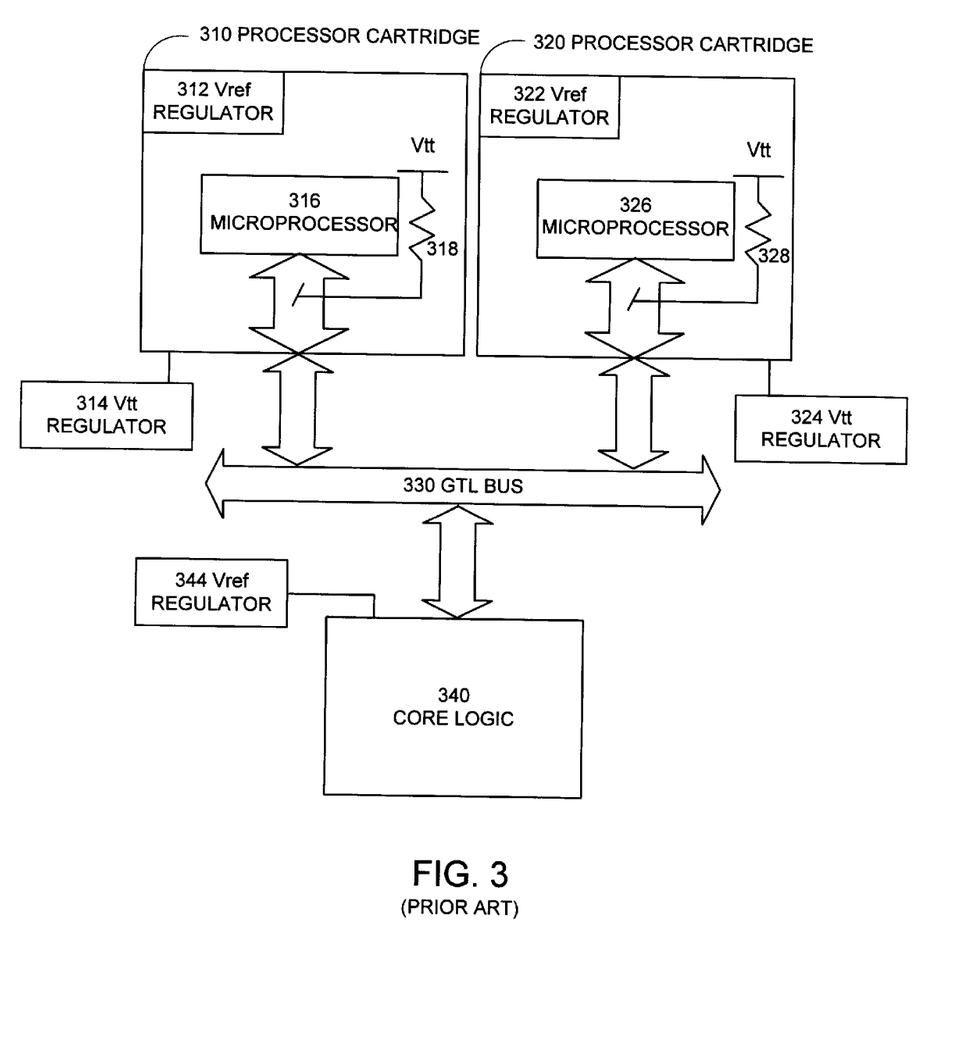
FIG. 3 illustrates a multiprocessor system built around a GTL bus 330 in accordance with an embodiment of the present invention.

In spite of the above-mentioned advantages of a GTL interface, GTL requires modifications to a computer system that can greatly increase cost. FIG. 3 illustrates a multiprocessor system using a GTL bus 330 to link together system components. More specifically, processor cartridge 310, processor cartridge 320 and core logic 340 are coupled to and communicate through GTL bus 330.

Processor cartridge 310 includes microprocessor 316, which interfaces to GTL bus 330. Microprocessor 316 may include a microprocessor such as the Pentium II, manufactured by the Intel Corporation of Santa Clara, Calif. Processor cartridge 310 is coupled to $V_{REF}$ regulator 312 and $V_{TT}$ regulator 314, which provide $V_{REF}$ and $V_{TT}$, respectively for GTL interfaces on microprocessor 316. The input/output pads of microprocessor 316 are coupled to $V_{TT}$ through resistors 318.

Processor cartridge 320 includes microprocessor 326, which interfaces to GTL bus 330. Processor cartridge 320 is coupled to $V_{REF}$ regulator 322 and $V_{TT}$ regulator 324, which provide $V_{REF}$ and $V_{TT}$, respectively for GTL interfaces on microprocessor 326. The input/output pads of microprocessor 326 are coupled to $V_{TT}$ through resistors 328.

Core logic 340 includes interfaces to peripheral buses and other system components. Core logic 340 additionally includes $V_{REF}$ regulator 344, which provides $V_{REF}$ for GTL receivers in core logic 340.

Figure 4:
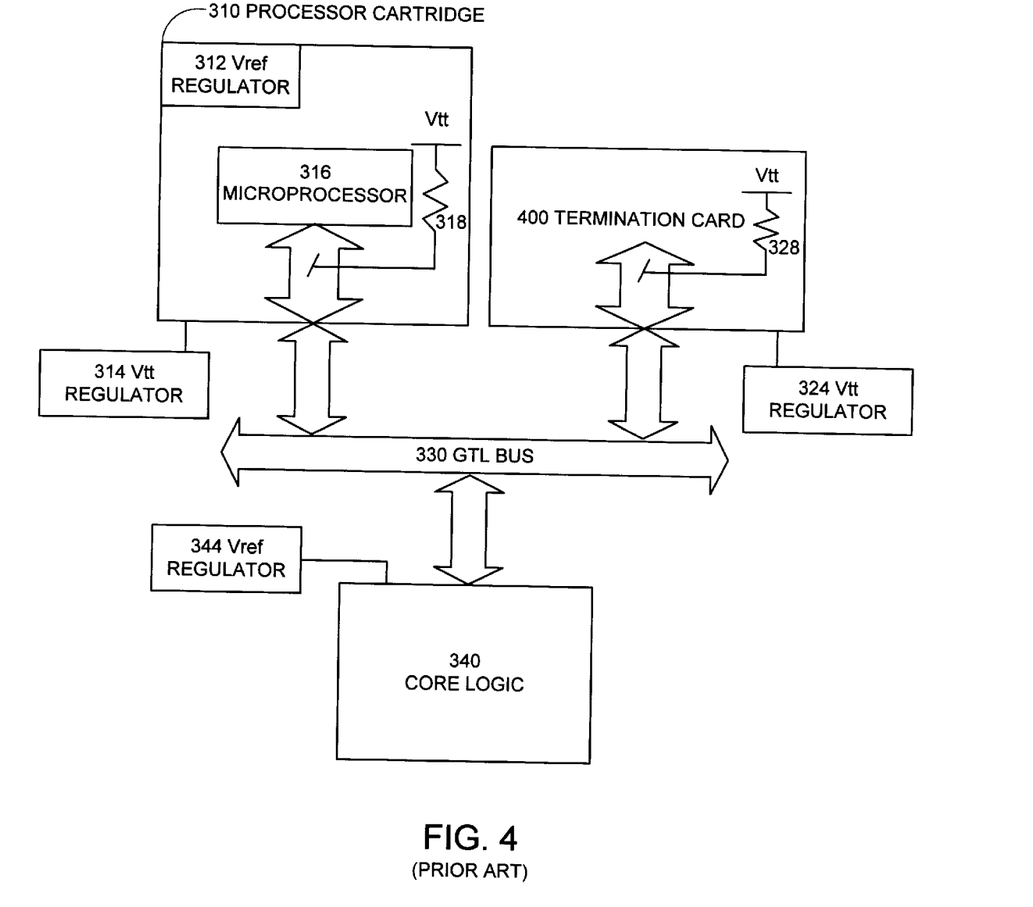
FIG. 4 illustrates the multiprocessor system of FIG. 3 with a termination card 400 substituted for processor cartridge 320 in accordance with an embodiment of the present invention.

FIG. 4 illustrates a single processor configuration for the multiprocessor system illustrated in FIG. 3. The system illustrated in FIG. 4 is the same as the system illustrated in FIG. 3, except for the fact that termination card 400 is substituted for processor cartridge 320. Note that termination card 400 is also coupled to voltage regulator 324 and includes terminal resistors 328. This is because GTL bus 330 must remain terminated even if processor cartridge 320 is removed.

Figure 5:
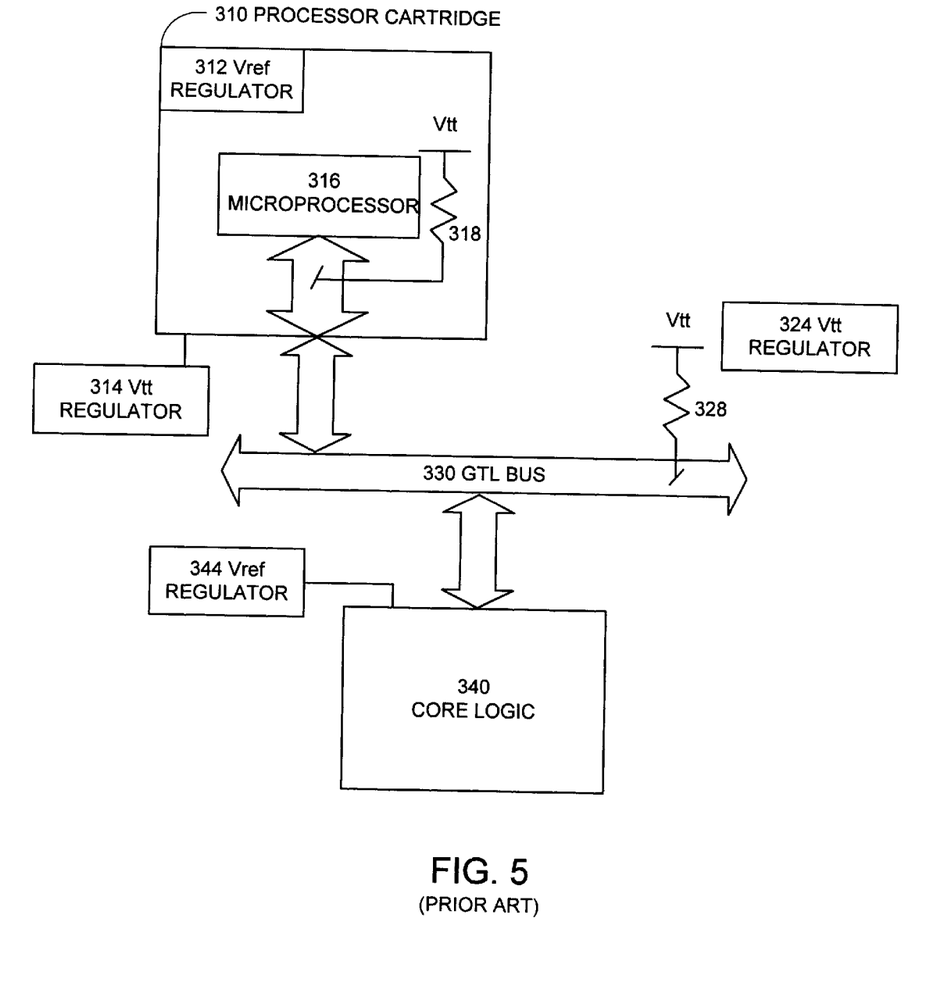
FIG. 5 illustrates the multiprocessor system of FIG. 3 with a termination resistor 328 substituted for processor cartridge 320 in accordance with an embodiment of the present invention.

FIG. 5 illustrates a single processor system, which is the same as the configuration illustrated in FIG. 2, except for the fact that it does not have a termination card. Instead, the lines of GTL bus 330 are directly terminated through resistors 328 to $V_{TT}$. In this configuration, the bus lines are permanently terminated.

The extra computer system components required for GTL communications add significantly to system cost. A separate regulator for $V_{REF}$ is required for each component receiving signals from GTL bus 330. Additionally, a separate voltage regulator for $V_{TT}$ is required at each end of GTL bus 330 to provide terminations for GTL bus 330.

The additional cost to implement GTL communications can be justified for high performance computing systems because people are willing to pay for improved performance. However, for cheaper computer systems,—especially sub-$1000 personal computers—people may be unwilling to pay the additional costs. Additionally, economies of scale make it expensive and impractical to produce two different microprocessor chips, one supporting a GTL interface and the other supporting a TTL or a LVTTL interface.

What is needed is a microprocessor chip that provides two modes of interfacing. A first mode supporting a high-performance open drain interface, and a second mode supporting a lower-cost TTL or LVTLL interface.

U.S. Pat. No. 5,530,379, entitled "Output Buffer Circuit that can Be Shared by a Plurality of Interfaces and a Semiconductor Device Using the Same," to Konishi et al. discloses an output driver for a random access memory, that supports two modes of operation, one as a GTL output driver and one as a LVTTL output driver. However, Konishi is not directed to the problem of reducing cost by eliminating bus terminations. Hence, Konishi does not disclose a method and an apparatus for eliminating a bus termination. Furthermore, Konishi discloses a complicated apparatus in which a pullup transistor is converted into an additional pulldown transistor, and Konishi does not disclose a slew rate control circuit, or a turn-off control circuit.

SUMMARY

The present invention provides a method for providing two different modes of operation for an output driver on an integrated circuit. A first mode provides an open drain driver, such as an enhanced GTL+ driver, for high-speed data transmission. A second mode provides a totem pole output driver, such as a TTL or a LVTLL driver, which does not require additional circuitry for external terminations, as is required for open drain drivers. Thus, one embodiment of the present invention can be characterized as an integrated circuit with an output buffer having a first mode that provides a driver for an open drain bus, and a second mode that provides a totem pole output. This output buffer receives a signal to be outputted from the integrated circuit and a mode select signal that selects between the first mode and the second mode. This output buffer also includes an output terminal coupled to an I/O pad, with a pullup transistor coupled between the output terminal and a high voltage, and a pulldown transistor coupled between the output terminal and a low voltage. The pulldown transistor includes a control input coupled to the signal to be outputted. This output buffer also includes a mode select circuit coupled between the signal to be outputted and a control input of the pullup transistor. This mode select circuit receives the mode select signal and is configured to select between a first mode and a second mode. In the first mode, the pullup transistor is activated when the signal to be outputted indicates a high value. In the second mode, the pullup transistor is activated for one clock cycle when the signal to be outputted indicates a high value.

In another embodiment of the present invention, the mode select circuit receives the mode select signal and is configured to activate the pullup transistor when the mode select signal indicates the second mode and the signal to be outputted indicates a high value. Otherwise, the mode select circuit leaves the pullup transistor inactive.

Another embodiment of the present invention includes an output enable signal that enables the output terminal to drive the I/O pad. This output enable signal is coupled to the mode select circuit. It is also coupled to a circuit between the signal to be outputted and the control input of the pulldown transistor, so that the pullup transistor and the pulldown transistor will be activated only if the output enable signal is asserted. This embodiment may be used for bi-directional I/O pads.

Another embodiment of the present invention includes a slew rate control circuit coupled between the signal to be outputted and the control input of the pulldown transistor, for controlling the rate at which voltage changes at the output terminal.

In another embodiment of the present invention, the first mode provides a LVTTL driver and the second mode provides a GTL driver.

In another embodiment of the present invention, the integrated circuit is a microprocessor chip.

Another embodiment of the present invention includes a bus line coupled to the I/O pad, the bus line being free of any external termination.

Another embodiment of the present invention includes a differential receiver coupled to the output pad. It also includes a reference voltage generation circuit within the integrated circuit and coupled to the differential receiver, for generating a reference voltage for the differential receiver.

Another embodiment of the present invention includes a mode select input pin on the integrated circuit coupled to the mode select signal. Another embodiment includes a mode select generation circuit coupled to a specified pin on the integrated circuit. This mode select generation circuit determines the state of the mode select signal based upon how the specific pin is driven during system reset. Yet another embodiment includes a mode select generation circuit coupled to an external reference voltage, this mode select generation circuit determines the state of the mode select signal based upon whether or not the external reference voltage input is within a valid range.

Another embodiment of the present invention includes a computer system having an integrated circuit with the above-described dual output modes.

Another embodiment of the present invention can be described as a method of providing a dual mode output from an integrated circuit. This method includes receiving an output mode signal indicating an open drain output mode or a totem pole output mode. This method also includes providing an open drain output signal using only one pulldown transistor if the mode signal indicates the open drain mode, and providing a totem pole output signal if the mode signal indicates the totem pole output mode.

Another embodiment of the present invention can be described as a method of providing a dual mode output from an integrated circuit. This method includes receiving an output mode signal indicating an enhanced GTL+ output mode or a totem pole output mode. This method also includes providing an enhanced GTL+ output signal if the mode signal indicates the enhanced GTL+ output mode, and providing a totem pole output signal if the mode signal indicates the totem pole output mode.

Another embodiment of the present invention can be described as a method for providing a dual mode output from an integrated circuit. This method includes providing to the integrated circuit an output mode signal indicating a first output mode or a second output mode. It also includes coupling an output pin of the integrated circuit to an open drain bus with an active termination if the mode signal indicates the first mode, and coupling an output pin of the integrated circuit to an unterminated bus if the mode signal indicates the second output mode.

DEFINITIONS

Enhanced GTL+—An enhanced GTL standard that includes a pullup transistor with active turn-off control at a GTL output driver. Under active turnoff control, the pullup transistor becomes active for one clock cycle to drive a high signal to an enhanced GTL+ output.

GTL—Gunning transceiver logic, a standard for communications across an open drain bus.

LVTTL—Low voltage transistor—transistor logic, a standard for communications between integrated circuits featuring totem pole output drivers.

Open drain bus—A bus terminated with a resistor to a high voltage and being pulled down to ground through a pulldown transistor.

Slew rate control circuit—a circuit that controls the rate at which a signal switches in order to reduce transient voltage swings.

Totem pole output—an output driver featuring a pullup resistor to a high voltage and a pulldown transistor to a low voltage.

Valid reference voltage range—a predefined range of voltages for a reference voltage signal. For example in GTL, a valid reference voltage range can be 0.8 volts plus or minus 0.05 volts.

$V_{CC}$—A high voltage for powering integrated circuits.

DETAILED DESCRIPTION OF THE INVENTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Description of One Embodiment of the Output Driver

Figure 6:
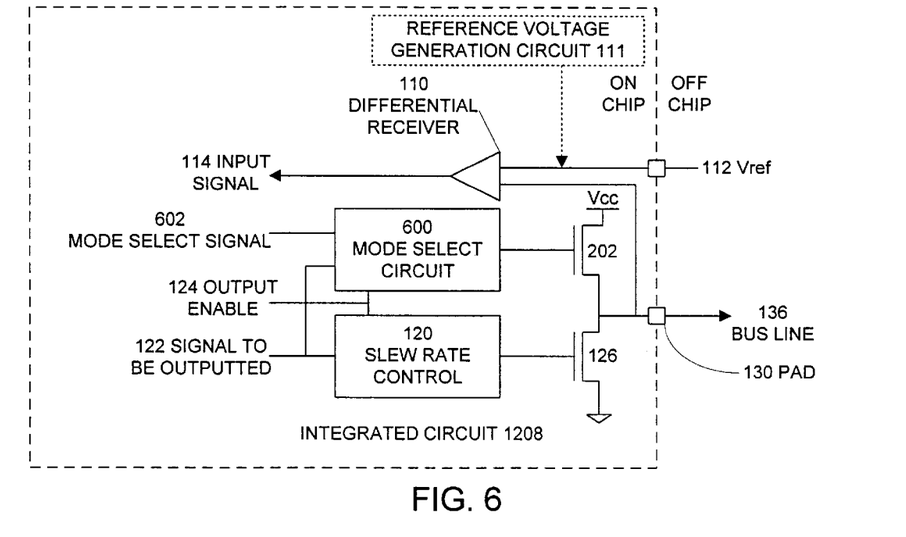
FIG. 6 illustrates a dual mode output circuit in accordance with an embodiment of the present invention.

FIG. 6 illustrates a dual mode output circuit in accordance with an embodiment of the present invention. The circuitry illustrated in FIG. 6 is the same as the circuitry illustrated for the enhanced GTL+ driver in FIG. 2, except that turn off control circuit 200 has been replaced with mode select circuit 600. In addition to receiving inputs from signal to be outputted 122 and output enable signal 124, mode select circuit 600 takes an input from mode select signal 602. When mode select signal 602 indicates the open drain mode, transistor 202 can still drive active turnoff, in which transistor 202 may be active for one clock cycle. However, in open drain mode transistor 202 is disabled from holding the bus to a high voltage. When mode select signal 602 indicates the totem pole output mode, mode select circuit 600 activates transistor 202 whenever the signal to be outputted 122 is asserted to a high value and output enable signal 124 is asserted. In this way, the embodiment illustrated in FIG. 6 allows the output driver to be used with an external termination in a high performance open drain mode, and without an external termination in a low cost TTL or LVTTL mode.

Mode select signal 602 can be generated in a number of ways. In one embodiment, mode select signal 602 is received from a mode select input pin on the integrated circuit. Another embodiment includes a mode select generation circuit coupled to a specified pin on the integrated circuit. In this embodiment, the mode select generation circuit determines the state of the mode select signal based upon how the specific pin is driven during system reset. Yet another embodiment includes a mode select generation circuit coupled to an external reference voltage input of the integrated circuit. This mode select generation circuit determines the state of the mode select signal based upon whether or not the external reference voltage input is within a valid range. In this embodiment, the reference voltage for the input differential receiver may be derived internally to the integrated circuit when the totem pole output mode is selected.

Figure 7:
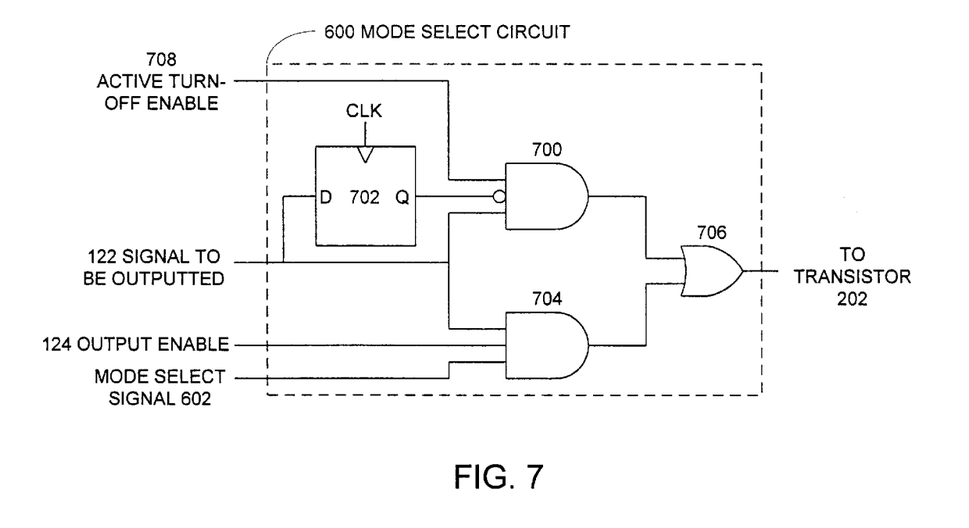
FIG. 7 illustrates the internal structure of mode select circuit 600 from FIG. 6 in accordance with an embodiment of the present invention.

FIG. 7 illustrates the internal structure of one embodiment of mode select circuit 600 from FIG. 6 in accordance with an embodiment of the present invention. The embodiment illustrated in FIG. 10 selects between a totem pole output mode and an enhanced GTL+ output mode. In this embodiment, mode select circuit 600 is implemented with a D flip-flop 702, two three-input AND gates 700 and 704, and a two-input OR gate 706. Signal to be outputted 122 feeds through D flip-flop 702, and then into an inverted input of AND gate 700. Signal to be outputted 122 also feeds directly into a non-inverted input of AND gate 700. AND gate 700 receives an additional input from active turnoff enable signal 708. In one embodiment, active turn-off enable signal 708 is merely an inverted mode select signal 602. In another embodiment, active turnoff enable signal 708 is a control signal from a state machine controlling the outputting of data from the integrated circuit. Signal to be outputted 122 also feeds into AND gate 704, as does output enable signal 124 and mode select signal 602. The outputs of AND gates 700 and 704 feed into inputs of OR gate 706. The output of OR gate 706 feeds into a control input of transistor 202 from FIG. 6.

The circuit illustrated in FIG. 7 operates as follows. When mode select signal is asserted to a high value, this indicates a totem pole output mode, and AND gate 704 is active. If signal to be outputted 122 and output enable signal 124 are both asserted, transistor 202 is activated.

On the other hand, when mode select signal 602 is asserted to a low value, this indicates the enhanced GTL+ output mode, wherein AND gate 700 is active, while AND gate 704 is inactive. In this case, if active turn-off enable 708 and signal to be outputted 122 are mode asserted transistor 202 is activated for one clock cycle, because when signal to be outputted feeds through D flip-flop 702 it disables AND gate 700 after one clock cycle. This activates transistor 202 for one clock cycle after bus line 136 is no longer driven low.

Figure 10:
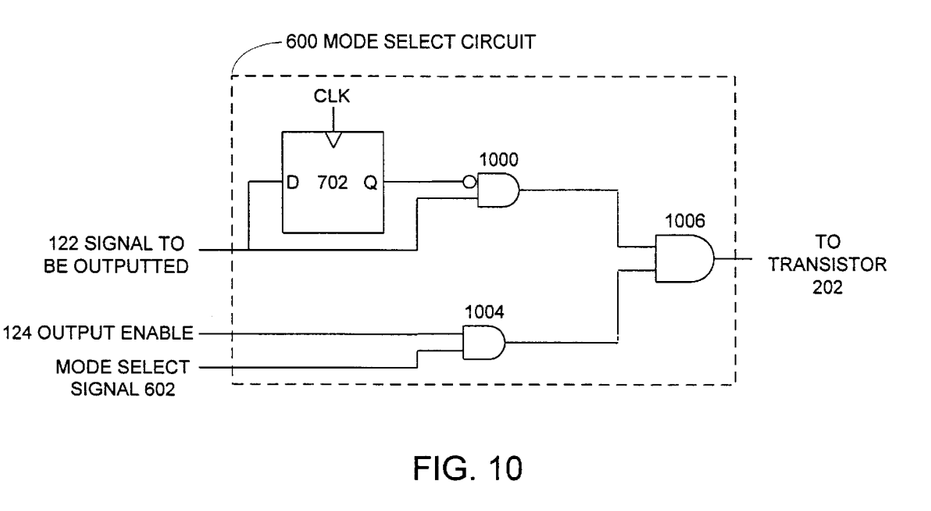
FIG. 10 illustrated another embodiment of mode select circuit 600 from FIG. 6.

FIG. 10 illustrated another embodiment of mode select circuit 600 from FIG. 6. The embodiment illustrated in FIG. 10 selects between a straight GTL output mode and a totem pole output mode. In this embodiment, mode select circuit 600 is implemented with a D flip-flop 702, and three two-input AND gates 1000, 1004 and 1006. Signal to be outputted 122 feeds through D flip-flop 702, and then into an inverted input of AND gate 1000. Signal to be outputted 122 also feeds into a non-inverted input of AND gate 1000. Signal to be outputted 122 also feeds into an input of AND gate 1004, as does output enable signal 124. The outputs of AND gates 1000 and 1004 feed into inputs of AND gate 1006. The output of AND gate 1006 feeds into a control input of transistor 202 from FIG. 6.

The circuit illustrated in FIG. 10 operates as follows. When mode select signal 602 is asserted to a high value, this indicates an enhanced GTL+ mode. If signal to be outputted 122 and output enable signal 124 are similarly asserted, transistor 202 is activated for one clock cycle. On the other hand, if mode select signal 602 is asserted to a low value, this indicates a GTL output mode, and pullup transistor 202 remains inactive.

Description of A Method of Providing Dual Output Modes

Figure 8:
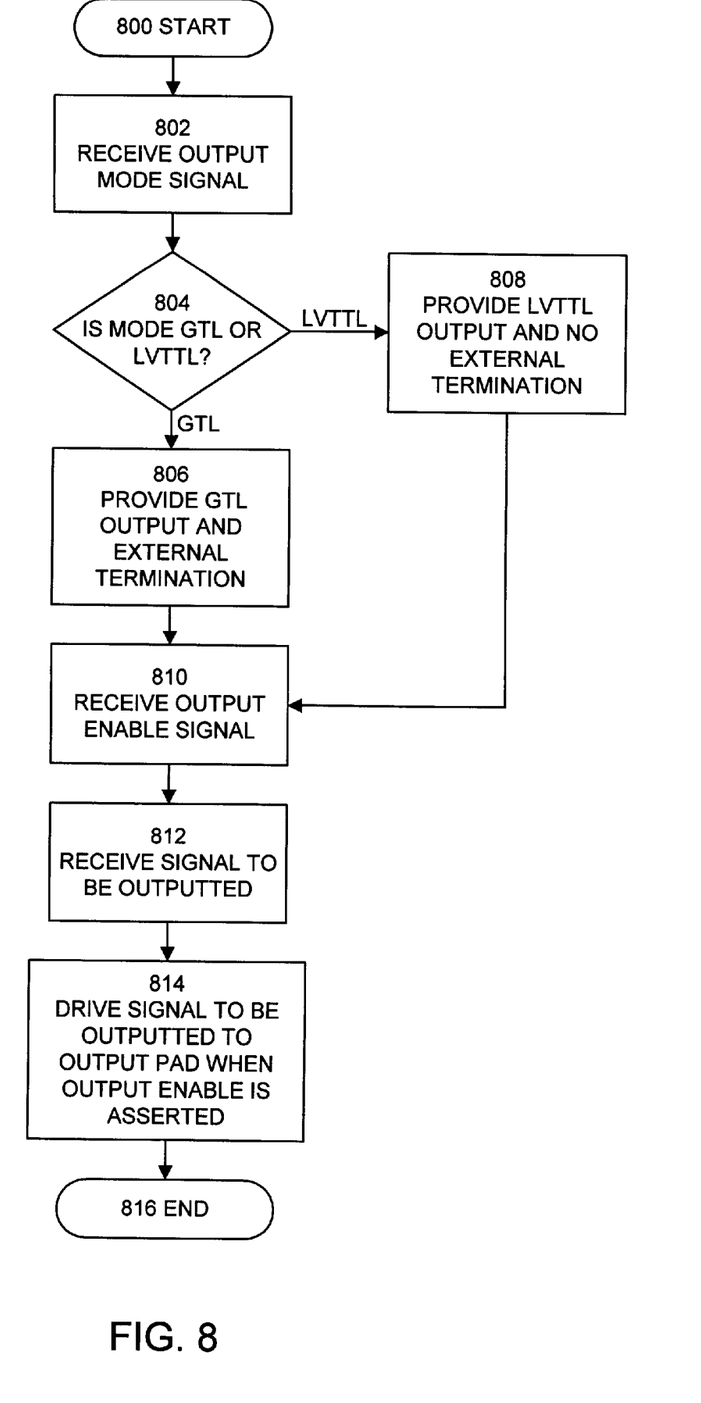
FIG. 8 is a flow chart illustrating the actions of the dual mode output circuit from FIG. 6 in accordance with an embodiment of the present invention.

FIG. 8 is a flow chart illustrating the actions of the dual mode output circuit of FIG. 6 in accordance with an embodiment of the present invention. In this embodiment, the system starts at state 800 and proceeds to state 802. At state 802, the system receives a mode select signal 602 indicating either a totem pole output mode, such as LVTTL, or an open drain output mode, such as GTL. The system then proceeds to state 804. In state 804, the system asks whether mode select signal 602 indicates a GTL or an LVTTL output mode. If an LVTTL output mode is indicated, the system advances to state 808, and provides an LVTTL output with no external termination on bus line 136. If a GTL output mode is indicated, the system proceeds to state 806 and provides a GTL output with an external termination on bus line 136. After states 806 and 808 are complete, the system proceeds to state 810. In state 810, the system receives an output enable signal 124. The system next proceeds to state 812. In state 812, the system receives a signal to be outputted 122. The system next proceeds to state 814. In state 814, the system drives the signal to be outputted 122 onto output pad 130 when output enable signal 124 is asserted. The system next proceeds to state 816, which is an end state.

Figure 9:
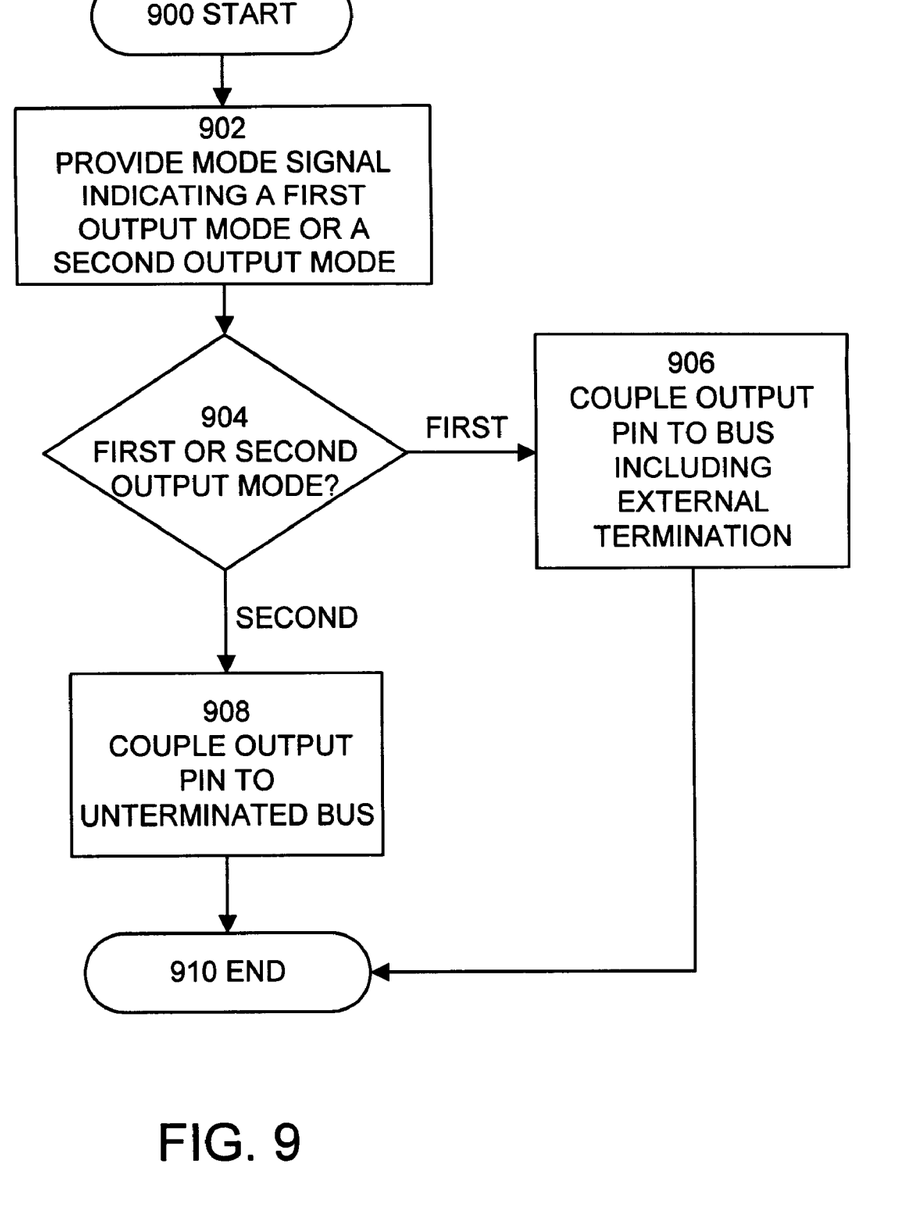
FIG. 9 is a flow chart illustrating the actions of a computer system integrator in using the dual mode output circuit from FIG. 6 to build a computer system in accordance with an embodiment of the present invention.

FIG. 9 is a flow chart illustrating the actions of a computer system integrator in using the dual mode output circuit of FIG. 6 to build a computer system in accordance with an embodiment of the present invention. In this embodiment, the computer system integrator ("the integrator") starts at state 900. The integrator then proceeds to state 902. In state 902, the integrator provides a mode signal indicating a first output mode or a second output mode. The integrator then proceeds to state 904. In state 904, integrator determines whether mode select signal 602 indicates the first output mode or the second output mode. If a second output mode is indicated, the integrator proceeds to state 908, in which the integrator couples the output pin to an unterminated bus line for a TTL or a LVTLL driver. If a first output mode is indicated, the integrator proceeds to state 906 and couples the output pins to bus lines including an external termination 135 for an open drain output signal. After states 906 and 908 are complete, the integrator proceeds to state 910, which is an end state.

Figure 11:
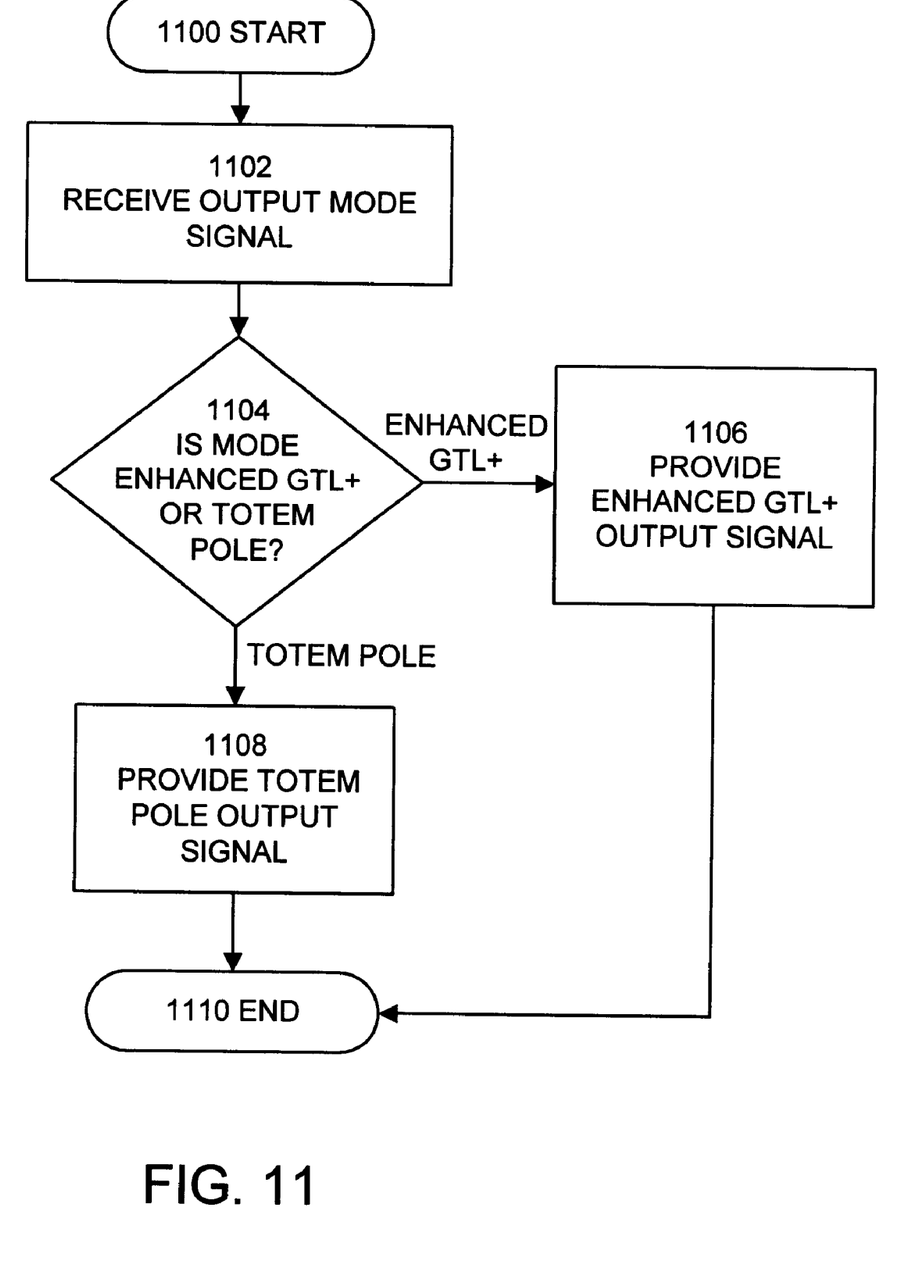
FIG. 11 is a flow chart illustrating the actions of the dual mode output circuit of FIG. 6 in accordance with another embodiment of the present invention.
Figure 12:
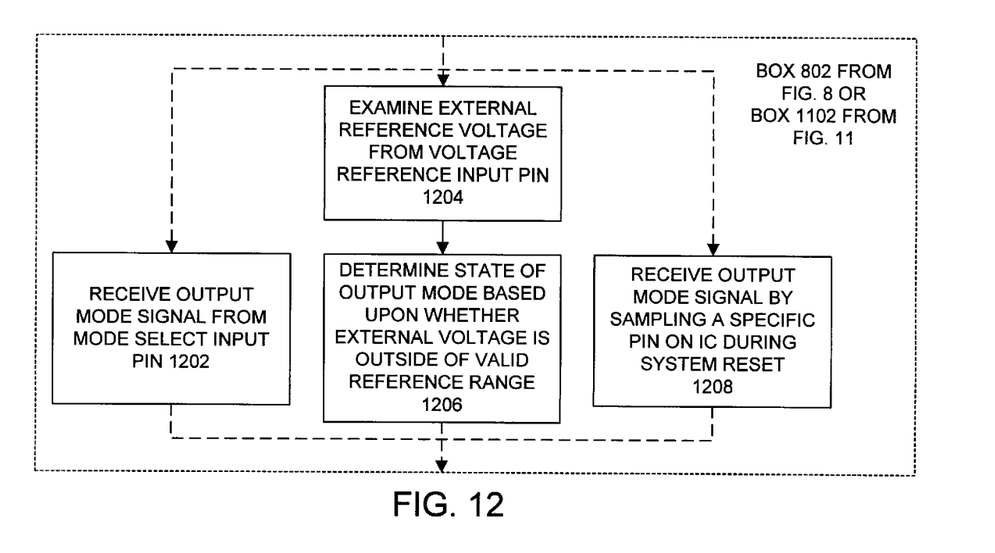
FIG. 12 is a flow chart illustrating alternative methods for obtaining an output mode signal in accordance with an embodiment of the present invention.
Figure 13:
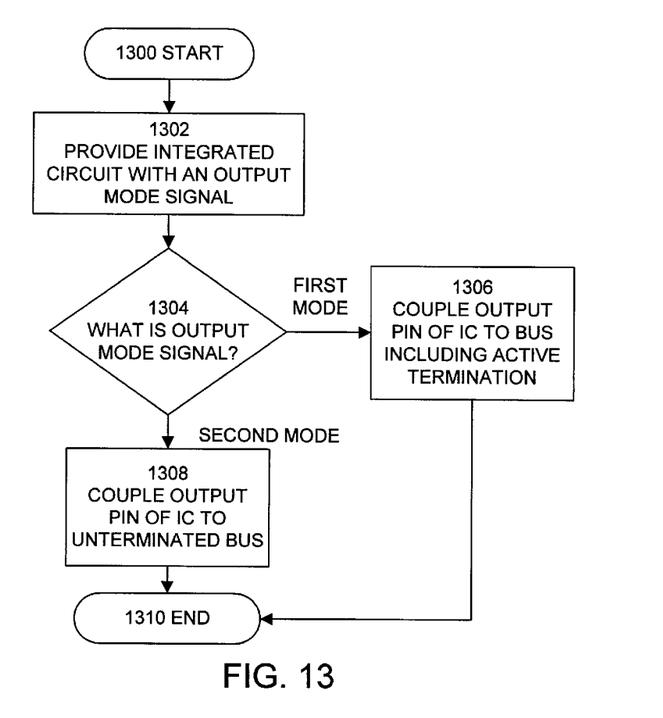
FIG. 13 is a flow chart illustrating how an output pin is coupled to different buses in different output modes in accordance with an embodiment of the present invention.

FIG. 11 is a flow chart illustrating the actions of the dual mode output circuit of FIG. 6 in accordance with another embodiment of the present invention. In this embodiment, the system starts at state 1100 and proceeds to state 1102. In state 1102, the system receives a mode select signal 602 indicating either a totem pole output mode or an enhanced GTL+ output mode. The system then proceeds to state 1104. In state 1104, the system asks whether mode select signal 602 indicates a totem pole or an enhanced GTL+ output mode. If a totem pole output mode is indicated, the system advances to state 1108 and provides a totem pole output. If an enhanced GTL+ output mode is indicated, the system proceeds to state 1106 and provides an enhanced GTL+ output. After states 1106 and 1108 are complete, the system proceeds to state 1110, which is an end state.

The foregoing descriptions of embodiments of the invention have been presented for purposes of illustration and description only. They are not intended to be exhaustive or to limit the invention to the forms disclosed. Obviously, many modifications and variations will be apparent to practitioners skilled in the art.

What is claimed is:

1. A method of providing a dual mode output signal for an integrated circuit, comprising:

receiving an output mode signal indicating a first output mode or second output mode;

wherein receiving the output mode signal includes sampling a specific pin on the integrated circuit during system reset to determine the state of the output mode signal;

providing an open drain output signal including activating a pullup transistor for one clock cycle if the output mode signal indicates the first output mode and a signal to be outputted has a high value; and providing a totem pole output signal if the mode signal indicates the second output mode.

2. The method of claim 1, including:

receiving an output enable signal;

receiving the signal to be outputted; and driving the signal to be outputted onto an output pad when the output enable signal is asserted.

3. The method of claim 1, wherein providing the totem pole output signal and providing an open drain output signal includes controlling the slew rate of the output signal.

4. The method of claim 1, wherein providing the totem pole output signal includes providing a LVTTL output.

5. The method of claim 1, wherein providing the open drain output signal includes providing an external termination.

6. The method of claim 1, wherein providing the open drain output signal includes applying the open drain output signal to an output pin of a microprocessor chip.

7. The method of claim 1, wherein providing the totem pole output signal includes providing a totem pole output signal to an unterminated bus line.

8. The method of claim 1, including generating a reference voltage signal for a differential receiver within the integrated circuit.

9. A method of providing a dual mode output signal for an integrated circuit, comprising:

receiving an output mode signal indicating a first output mode or second output mode;

wherein receiving the output mode signal includes,
examining an external reference voltage from a voltage reference input pin, and
determining the state of the output mode signal based upon whether the external voltage is outside of a valid reference voltage range;

providing an open drain output signal including activating a pullup transistor for one clock cycle if the output mode signal indicates the first output mode and a signal to be outputted has a high value; and providing a totem pole output signal if the mode signal indicates the second output mode.

10. A method of providing a dual mode output signal for a microprocessor, comprising:

receiving an output mode signal indicating a first output mode or second output mode;

wherein receiving the output mode signal includes sampling a specific pin on the integrated circuit during system reset to determine the state of the output mode signal;

providing an enhanced GTL+ output signal, including activating a pullup transistor for one clock cycle if the output mode signal indicates the first output mode and a signal to be outputted has a high value; and providing an LVTTL output signal if the mode signal indicates the second output mode;

receiving an output enable signal;

receiving the signal to be outputted;

driving the signal to be outputted onto an output pad when the output enable signal is asserted; and controlling the slew rate of signals driven onto the output pad.

11. The method of claim 10, wherein providing a totem pole output signal includes providing a totem pole output signal to an unterminated bus line.

12. The method of claim 10, including generating a reference voltage signal for a differential receiver within the integrated circuit.

13. A method of providing a dual mode output signal for a microprocessor, comprising:

receiving an output mode signal indicating a first output mode or second output mode;

wherein receiving the output mode signal includes,
examining an external reference voltage from a voltage reference input pin, and
determining the state of the output mode signal based upon whether the external voltage is outside of a valid reference voltage range;

providing an enhanced GTL+ output signal, including activating a pullup transistor for one clock cycle if the output mode signal indicates the first output mode and a signal to be outputted has a high value; and providing an LVTTL output signal if the mode signal indicates the second output mode;

receiving an output enable signal;

receiving the signal to be outputted;

driving the signal to be outputted onto an output pad when the output enable signal is asserted; and controlling the slew rate of signals driven onto the output pad.

* * * * *